(12) United States Patent
Zhang et al.

(10) Patent No.: US 12,396,147 B2
(45) Date of Patent: Aug. 19, 2025

(54) DISPLAY PANEL BONDING DEVICE AND CORRECTION APPARATUS

(71) Applicant: KunShan Go-Visionox Opto-Electronics Co., Ltd, Jiangsu (CN)

(72) Inventors: Qi Zhang, Kunshan (CN); Shuo Yang, Kunshan (CN); Bin Yang, Kunshan (CN); Yahong Yuan, Kunshan (CN); Chunxiao Gu, Kunshan (CN); Chaoyue Zhu, Kunshan (CN)

(73) Assignee: Kunshan Go-Visionox Opto-Electronics Co., Ltd, Kunshan (CN)

( * ) Notice: Subject to any disclaimer, the term of this patent is extended or adjusted under 35 U.S.C. 154(b) by 669 days.

(21) Appl. No.: 17/713,431

(22) Filed: Apr. 5, 2022

(65) Prior Publication Data

US 2022/0232748 A1 Jul. 21, 2022

Related U.S. Application Data

(63) Continuation of application No. PCT/CN2021/079676, filed on Mar. 9, 2021.

(30) Foreign Application Priority Data

Apr. 28, 2020 (CN) .......................... 202010351084.9

(51) Int. Cl.
*H05K 13/08* (2006.01)
*G06F 1/18* (2006.01)

(52) U.S. Cl.
CPC ......... *H05K 13/0815* (2018.08); *G06F 1/181* (2013.01); *H05K 13/0812* (2018.08); *Y10T 29/49131* (2015.01)

(58) Field of Classification Search
CPC ............ H05K 13/0815; H05K 13/0812; G06F 1/181; Y10T 29/49131; G02B 27/32; G02B 27/62; G12B 5/00; G09F 9/00
See application file for complete search history.

(56) References Cited

U.S. PATENT DOCUMENTS

| | | | | |
|---|---|---|---|---|
| 4,866,837 A | * | 9/1989 | Heissenberger | ........ B23P 19/10 29/833 |
| 5,407,519 A | * | 4/1995 | Joffe | ....................... B32B 37/10 156/367 |

(Continued)

FOREIGN PATENT DOCUMENTS

| | | |
|---|---|---|
| CN | 107238957 A | 10/2017 |
| CN | 107830801 A | 3/2018 |

(Continued)

OTHER PUBLICATIONS

International Search Report (with English Translation) and Written Opinion mailed May 26, 2021, in corresponding International Application No. PCT/CN2021/079676, 12 pages.

(Continued)

*Primary Examiner* — Sunil K Singh
*Assistant Examiner* — Jose K Abraham
(74) *Attorney, Agent, or Firm* — Maier & Maier, PLLC

(57) ABSTRACT

A display panel bonding device and a correction apparatus and method thereof. The correction apparatus includes: a fixture assembly including a first fixture and a second fixture coordinating with each other. The first fixture is provided with a first alignment mark, the second fixture is provided with a second alignment mark, and alignment between the first fixture and the second fixture is achieved via the first alignment mark and the second alignment mark; and an image acquisition assembly configured to acquire a first image of the first alignment mark of the first fixture and a second image of the second alignment mark of the second (Continued)

fixture respectively. The first image and the second image are used for acquiring an alignment parameter of the first alignment mark and the second alignment mark to correct alignment between the first fixture and the second fixture.

14 Claims, 4 Drawing Sheets

(56) References Cited

U.S. PATENT DOCUMENTS

| | | | | |
|---|---|---|---|---|
| 5,499,127 | A * | 3/1996 | Tsubota | G02F 1/1341 349/158 |
| 5,855,637 | A * | 1/1999 | Yakou | H01J 9/261 156/89.12 |
| 5,928,399 | A * | 7/1999 | Yakou | H01J 9/261 65/273 |
| 6,739,929 | B2 * | 5/2004 | Furukawa | G02F 1/1303 445/24 |
| 6,774,651 | B1 * | 8/2004 | Hembree | H01L 21/681 324/750.19 |
| 6,922,229 | B2 * | 7/2005 | Yawata | B32B 37/10 349/190 |
| 9,851,645 | B2 * | 12/2017 | Wagenleitner | H01L 22/26 |
| 2003/0159769 | A1 * | 8/2003 | Ogimoto | B32B 38/1841 156/64 |
| 2004/0095546 | A1 * | 5/2004 | Lee | B32B 38/1833 349/187 |
| 2012/0255365 | A1 * | 10/2012 | Wimplinger | H01L 21/67092 73/760 |
| 2015/0231873 | A1 * | 8/2015 | Okamoto | B32B 41/00 156/64 |

FOREIGN PATENT DOCUMENTS

| | | |
|---|---|---|
| CN | 207459003 U | 6/2018 |
| CN | 108861535 A | 11/2018 |
| CN | 109003548 A | 12/2018 |
| CN | 209920705 U | 1/2020 |
| CN | 111524449 A | 8/2020 |
| JP | 2014-132356 A | 7/2014 |
| JP | 2019-030981 A | 2/2019 |

OTHER PUBLICATIONS

First Office Action issued Aug. 30, 2021, corresponding to Chinese Application No. 202010351084.9; 12 pages, (with English Translation).

* cited by examiner

DISPLAY PANEL BONDING DEVICE AND CORRECTION APPARATUS

CROSS REFERENCE TO RELATED APPLICATIONS

The application is a continuation of International Application No. PCT/CN2021/079676, filed on Mar. 9, 2021, which claims priority to Chinese Patent Application No. 202010351084.9, filed on Apr. 28, 2020, both of which are hereby incorporated by reference in their entireties.

TECHNICAL FIELD

The application relates to the technical field of electronic products, in particular to a display panel bonding device and a correction apparatus and method thereof.

BACKGROUND

For different products, it is required to replace a cover plate and a bonding indenter of a curved surface bonding device. After each replacement, ensuring a relative position between the cover plate and the bonding indenter plays a vital role in bonding yield. It is required to place the cover plate and the bonding indenter on a cover plate base and an indenter base before bonding. At present, most devices use a mounting method in which a dowel pin is used to determine a relative position between the cover plate base and the indenter base, so as to achieve alignment of the cover plate and the bonding indenter. However, due to a processing error and a mounting error of the dowel pin itself, there is a deviation of the relative position between the cover plate base and the indenter base, resulting in a deviation of the relative position between the bonding indenter and the cover plate. It is necessary to conduct several bonding experiments to calculate a bonding error and adjust a positioning thread gap to achieve center alignment of the cover plate base and the indenter base, so as to eliminate an alignment deviation. A correction process is complex and cumbersome and has a large accuracy error, which affects bonding accuracy.

Therefore, there is an urgent need for a correction apparatus and method adapted for adjusting a display panel bonding device.

SUMMARY

Embodiments of the application provide a display panel bonding device and a correction apparatus and method thereof, wherein a fixture assembly with alignment marks is used for alignment between two bases of a base assembly of the display panel bonding device, which makes an alignment process faster and more accurate and improves alignment efficiency and bonding yield.

Embodiments of the application provides a correction apparatus adapted for adjusting a display panel bonding device, including: a fixture assembly including a first fixture and a second fixture coordinating with each other, wherein the first fixture is provided with a first alignment mark, the second fixture is provided with a second alignment mark, and alignment between the first fixture and the second fixture is achieved via the first alignment mark and the second alignment mark; and an image acquisition assembly configured to acquire a first image of the first alignment mark of the first fixture and a second image of the second alignment mark of the second fixture respectively, wherein the first image and the second image are used for acquiring an alignment parameter of the first alignment mark and the second alignment mark to correct the alignment between the first fixture and the second fixture.

Embodiments of the application provides a correction method based on the above mentioned correction apparatus, the method including: mounting the first fixture at a mounting position for a bonding member base of the display panel bonding device and mounting the second fixture at a mounting position for a display module base of the display panel bonding device; acquiring, by the image acquisition assembly, a first image of the first alignment mark of the first fixture and a second image of the second alignment mark of the second fixture respectively; processing the first image and the second image to acquire an alignment parameter of the first alignment mark and the second alignment mark; and driving the fixture assembly to move according to the alignment parameter, so as to align the first alignment mark and the second alignment mark and thus implement correction of alignment between the bonding member base and the display module base of the display panel bonding device.

Embodiments of the application provides a display panel bonding device, including: two bases including a bonding member base for mounting a member to be bonded and a display module base for mounting a display module to be bonded; a first support having a first mounting position for the bonding member base; a second support having a second mounting position for the display module base; and the correction apparatus as described in the above embodiments, wherein the first fixture is mounted at the first mounting position for the bonding member base on the first support, and the second fixture is mounted at the second mounting position for the display module base on the second support.

The correction apparatus adapted for adjusting the display panel bonding device provided by the embodiments of the application includes the fixture assembly and the image acquisition assembly. The fixture assembly includes the first fixture and the second fixture coordinating with each other. The fixture assembly is used to replace the bonding member base and the display module base of the display panel bonding device for position correction. The first image of the first alignment mark of the first fixture and the second image of the second alignment mark of the second fixture are respectively acquired by the image acquisition assembly, and the alignment parameter of the first alignment mark and the second alignment mark is acquired according to the first image and the second image, so that the first alignment mark and the second alignment mark may be aligned with each other, and thus the alignment between the first fixture and the second fixture may be achieved. The alignment between the first fixture and the second fixture is equivalent to the alignment between the bonding member base and the display module base of the display panel bonding device, and thus the alignment between the bonding member base and the display module base of the display panel bonding device may be corrected. Compared with direct alignment between the bonding member base and the display module base of the display panel bonding device, the alignment of the fixture assembly with alignment marks makes the alignment process faster and more accurate, and improves the alignment efficiency and the bonding yield.

DETAILED DESCRIPTION

Features and exemplary embodiments of various aspects of the application will be described in detail below. In order to make objects, technical solutions, and advantages of the application more clear, the application will be further described in detail below in combination with accompanying drawings and specific embodiments. It should be appreciated that the specific embodiments described herein are only intended to explain the application and not to limit the application. For those skilled in the art, the application may be implemented without some of the specific details. The following description of the embodiments is only to provide better understanding of the application by showing examples of the application.

In order to better understand the application, a correction apparatus and method adapted for adjusting a display panel bonding device and a display panel bonding device according to embodiments of the application are described in detail below in combination with FIGS. 1 to 4.

Figure 1:
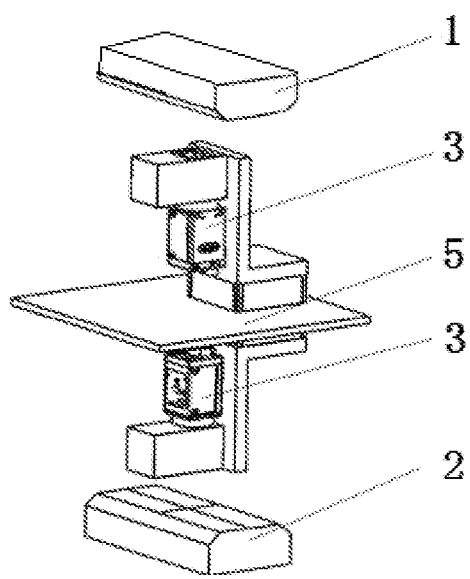
FIG. 1 is a structure diagram of a correction apparatus adapted for adjusting a display panel bonding device according to embodiments of the application.

FIG. 1 illustrates a structure diagram of a correction apparatus adapted for adjusting a display panel bonding device according to embodiments of the application. As shown in FIG. 1, the correction apparatus adapted for adjusting the display panel bonding device according to the embodiments of the application includes a fixture assembly and an image acquisition assembly 3. The fixture assembly includes a first fixture 1 and a second fixture 2 coordinating with each other. The first fixture 1 is provided with a first alignment mark. The second fixture 2 is provided with a second alignment mark. Alignment between the first fixture 1 and the second fixture 2 is achieved via the first alignment mark and the second alignment mark. The image acquisition assembly 3 is configured to acquire a first image of the first alignment mark of the first fixture 1 and a second image of the second alignment mark of the second fixture 2, respectively, and acquire an alignment parameter of the first alignment mark and the second alignment mark according to the first image and the second image to correct alignment between the first fixture 1 and the second fixture 2 and thus correct alignment of two bases, i.e., a bonding member base 6 and a display module base 7, of a base assembly of the display panel bonding device, when the first fixture 1 and the second fixture 2 are replaced by the bonding member base 6 and the display module base 7 of the display panel bonding device.

The correction apparatus adapted for adjusting the display panel bonding device provided by the embodiments of the application includes the fixture assembly and the image acquisition assembly 3. The fixture assembly includes the first fixture 1 and the second fixture 2 coordinating with each other. The first fixture 1 and the second fixture 2 are aligned, therefore the bonding member base 6 and the display module base 7 are aligned. Aligning the first fixture 1 and the second fixture 2 is equivalent to aligning the bonding member base 6 and the display module base 7 of the base assembly of the display panel bonding device. The fixture assembly is used to replace the base assembly of the display panel bonding device for position correction. The first image of the first alignment mark of the first fixture 1 and the second image of the second alignment mark of the second fixture 2 are acquired by the image acquisition assembly 3 respectively and the alignment parameter of the first alignment mark and the second alignment mark is acquired based on the first image and the second image, so that the alignment between the first fixture 1 and the second fixture 2 may be achieved. The alignment between the first fixture 1 and the second fixture 2 is equivalent to the alignment of the base assembly of the display panel bonding device, so that the alignment of the base assembly of the display panel bonding device may be corrected.

When the base assembly is positioned and fixed by a dowel pin, after the base assembly is mounted, a bonding error can only be calculated by multiple bonding experiments during actual bonding. According to the calculated bonding error, a thread gap of a dowel pin hole is adjusted to achieve center alignment of the base assembly and thus achieve alignment of a cover plate and a bonding indenter. Since a display module is supported by the bonding indenter, the display module may be accurately bonded to the cover plate. However, a process of multiple experiments is complex and cumbersome and has a large accuracy error, which affects bonding accuracy. In particular, as a machining accuracy for other positions of the base assembly is relatively low except for the position of the dowel pin hole, it is impossible to determine a base point for positioning directly by shooting with a camera.

In the embodiments provided by the application, the fixture assembly with alignment marks is additionally used for alignment of the base assembly, which only needs one alignment adjustment, so the alignment process is faster and more accurate and the alignment efficiency is improved. Moreover, the correction apparatus adapted for adjusting the display panel bonding device of the application can ensure an alignment accuracy of the base assembly after the fixture assembly is replaced with the base assembly, which avoids subsequently affecting the bonding accuracy between the display module and the cover plate and thus improves the bonding yield.

The operation of acquiring the alignment parameter of the first alignment mark and the second alignment mark based on the first image and the second image to correct the alignment between the first fixture and the second fixture, can be performed by the following steps: obtaining the alignment parameter by calculating after acquiring the first image and the second image, and then manually adjusting the display panel bonding device according to the alignment parameter or inputting the alignment parameter to an actuator of the display panel bonding device for automatic adjustment to implement alignment correction. Optionally, the first image and the second image can be transmitted by a transmitting module of the correction apparatus to a background computing apparatus of the display panel bonding device for processing to acquire the alignment parameter, and the alignment correction is implemented by a controller and a displacement platform of the display panel bonding device itself. The alignment correction may also be implemented by a manual adjustment. Optionally, a processing chip of the correction apparatus itself may process the first image and the second image locally to acquire the alignment parameter and then the alignment correction is implemented by a manual or automatic adjustment.

In some optional embodiments, the first fixture 1 includes a first plane equivalent to a bonding member base 6 of the base assembly, and the first alignment mark is provided on the first plane. The second fixture 2 includes a second plane equivalent to a display module base 7 of the base assembly, and the second alignment mark is provided on the second plane.

It should be noted that in order to improve the alignment accuracy between the first fixture 1 and the second fixture 2, the first plane and the second plane are usually axisymmetric or centrosymmetric figures, such as a rectangle, a trapezoid and so on. That is, regular plane figures, centers of which may be conveniently determined, are used as an equivalent of the bonding member base 6 and the display module base 7 with irregular three-dimensional shapes.

In order to facilitate alignment, the first alignment mark and the second alignment mark are figures, center points of which coincide with those of the first plane and the second plane. Specifically, a cross shape or a circle having a marked center may be used as the first alignment mark and the second alignment mark. For example, when both the first plane and the second plane are rectangular planes, the first alignment mark and the second alignment mark are crosshairs formed across midpoints of opposite edges of the rectangular planes. Of course, the first alignment mark and the second alignment mark may also be X-shaped marks formed by two diagonals of the rectangular planes. In order to facilitate shooting and identification, the first alignment mark and the second alignment mark may be made in a form of machining grooves, and their position accuracy is <±5 μm. A bonding member is usually a glass cover plate, which is placed on the bonding member base during bonding. The display module base is used to support the bonding indenter and thus support the display module. In a bonding process of a curved cover plate and the display module, the bonding indenter is usually a deformable profiling indenter with flexibility and certain hardness such as silica gel.

In some optional embodiments, the correction apparatus further includes a first displacement platform 4 configured to assemble and drive at least one of the first fixture 1 and the second fixture 2 to move to achieve the alignment between the first fixture 1 and the second fixture 2; and a processing module configured to process the first image and the second image to acquire the alignment parameter of the first alignment mark and the second alignment mark, and adjust the first displacement platform 4 according to the alignment parameter to align the first alignment mark and the second alignment mark. Optionally, the first displacement platform 4 has a displacement accuracy error equal to or less than 3 μm.

The first displacement platform 4 is configured to assemble and drive at least one of the first fixture 1 and the second fixture 2 to move to achieve the alignment between the first fixture 1 and the second fixture 2. Specifically, the first displacement platform 4 may be assembled and connected with only one of the first fixture 1 and the second fixture 2 to drive only the one, which is assembled to the first displacement platform 4, to move, or it may also be connected with both the first fixture 1 and the second fixture 2 to drive the first fixture 1 and the second fixture 2 to move.

When in use, after the image acquisition component acquires the first image of the first alignment mark of the first fixture 1 and the second image of the second alignment mark of the second fixture 2 respectively, the first image and the second image are processed to acquire the alignment parameter of the first alignment mark and the second alignment mark, and then the first displacement platform 4 is adjusted according to the alignment parameter to align the first alignment mark and the second alignment mark, so as to achieve the alignment between the first fixture 1 and the second fixture 2.

In order to acquire the first image and the second image of the first alignment mark and the second alignment mark, in some optional embodiments, the image acquisition assembly 3 includes at least two image acquisition units, shooting directions of which respectively face the first alignment mark and the second alignment mark.

Since the at least two image acquisition units respectively facing the first alignment mark and the second alignment mark are used for shooting, in order to ensure the accuracy of subsequent image processing, it is generally necessary to arrange respective image acquisition units along a same straight line, that is, to ensure the alignment of shooting positions of the image acquisition units, so that a relative position between the first image and the second image of the photographed first alignment mark and second alignment mark is substantially not affected by the alignment parameter between the image acquisition units.

In order to adjust the alignment between the image acquisition units, in some optional embodiments, a second displacement platform 5 is also included. The second displacement platform 5 is provided with the two image acquisition units and is configured to assemble and drive at least one of the two image acquisition units to move, to achieve the alignment between the two image acquisition units and the alignment between the two image acquisition units and the fixture assembly.

Specifically, the second displacement platform 5 includes two fixing arms for fixing the two image acquisition units, respectively. The two image acquisition units are arranged up and down. The relative position between the image acquisition units is adjusted through the two fixing arms, so that shooting centers of the two image acquisition units are on the same straight line with respect to the fixture assembly. The image acquisition unit may specifically be an industrial camera, which has a higher image stability, a higher transmission capability and a higher anti-interference capability compared with a civil camera (i.e., a video camera).

In order to ensure the alignment accuracy, in some optional embodiments, the displacement accuracy error of the first displacement platform 4 is equal to or less than 3 μm; the displacement accuracy error of the second displacement platform 5 is equal to or less than 5 μm. Both 3 μm and 5 μm refer to absolute values of the displacement accuracy errors. That is, depending on a moving direction and a reference, the displacement accuracy errors may be positive or negative.

Optionally, the correction apparatus further includes a third displacement platform, which is configured to assemble and drive the first fixture 1 and the second fixture 2 to move toward each other. The third displacement platform drives the first fixture 1 and the second fixture 2 to move toward each other, so as to achieve the alignment of the first fixture 1 and the second fixture 2 in a third direction Z. When the bonding member is to be bonded to the display module, it is required to align the relative position between the first fixture 1 and the second fixture 2 in the third direction Z. If there is a misalignment, an interaction force between the bonding member and the display module may be too large, resulting in damage to the bonding member or the display module. Therefore, the first fixture 1 and the second fixture 2 may be pre-aligned in the third direction Z, and the relative position of the first fixture 1 and the second fixture 2 may be adjusted by the third displacement platform. The third displacement platform may be a platform powered by a servo motor.

Figure 2:
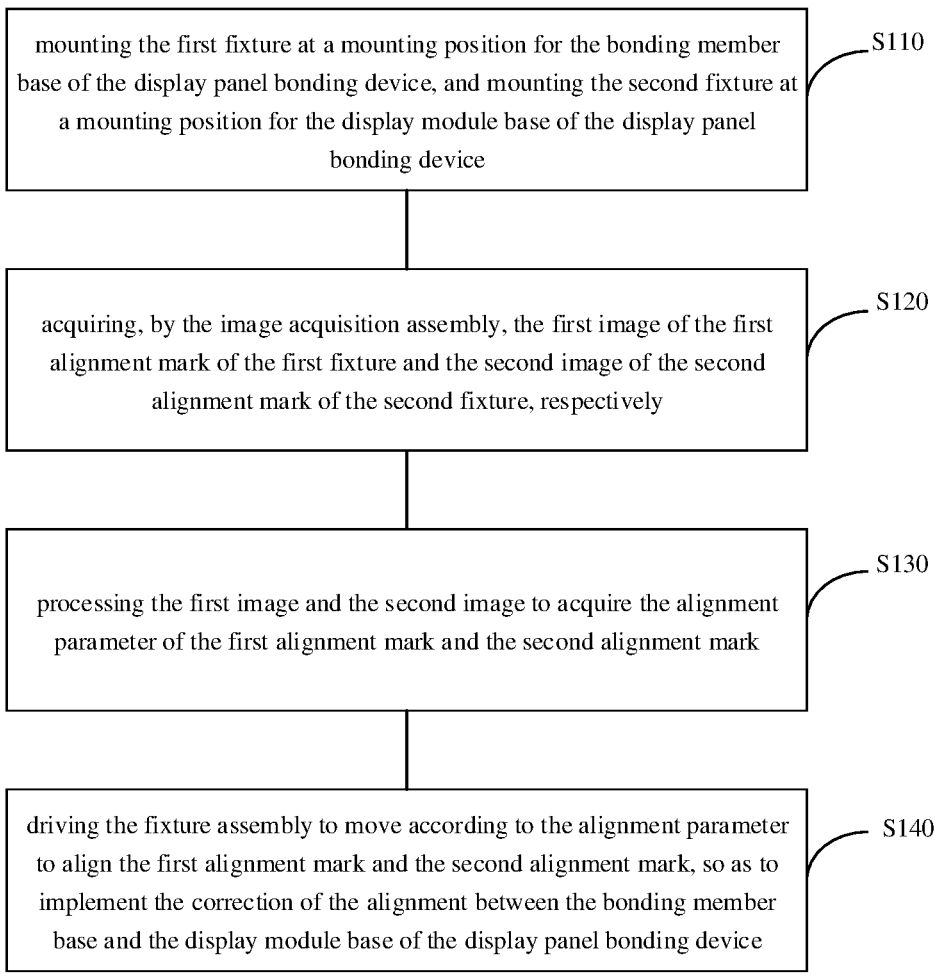
FIG. 2 is a flow diagram of a correction method adapted for adjusting a display panel bonding device according to embodiments of the application.

Specifically, the first displacement platform 4 and the second displacement platform 5 may be one of a UVW platform or a XYθ platform, which comprises an upper plate, a lower plate and four monomer groups. UVW corresponds to three power axes respectively, wherein there are two motors in X-axis direction (i.e., VW axis), there is one motor in Y-axis direction (i.e., U axis), the two motors in the X-axis operate synchronously to realize a movement in the X-axis, the one motor in the Y-axis controls a movement in the Y-axis, and there is a θ shaft rotation when the two motors in the X-axis are not synchronized. In this way, the movements in the X and Y directions and the θ shaft rotation are realized by controlling the three motors and thus the alignment is achieved. Although the XYθ platform has a different structure from the UVW platform, they both achieve the alignment through the movements in the X-axis and Y-axis and the θ shaft rotation. A user may choose the UVW platform or the XYθ platform according to actual requirements. The application also provides a correction method adapted for adjusting the display panel bonding device. FIG. 2 shows a flow diagram of an embodiment of the correction method adapted for adjusting the display panel bonding device of the application. As shown in FIG. 2, the correction method adapted for adjusting the display panel bonding device according to the embodiment of the application includes:

S110: mounting the first fixture 1 at a mounting position for the bonding member base 6 of the display panel bonding device, and mounting the second fixture 2 at a mounting position for the display module base 7 of the display panel bonding device;

S120: acquiring, by the image acquisition assembly 3, the first image of the first alignment mark of the first fixture 1 and the second image of the second alignment mark of the second fixture 2, respectively;

S130: processing the first image and the second image to acquire the alignment parameter of the first alignment mark and the second alignment mark; and S140: driving the fixture assembly to move according to the alignment parameter to align the first alignment mark and the second alignment mark, so as to implement the correction of the alignment between the bonding member base and the display module base of the display panel bonding device.

In step S110, it is required to position the first fixture 1 and the second fixture 2 of the fixture assembly instead of the base assembly. Therefore, the first fixture 1 and the second fixture 2 are firstly fixed at the mounting positions for the base assembly, that is, the first fixture 1 and the second fixture 2 are used as an equivalent of the bonding member base 6 and the display module base 7 of the base assembly for positioning.

In step S120, the first image of the first alignment mark of the first fixture 1 and the second image of the second alignment mark of the second fixture 2 are usually acquired by the image acquisition assembly 3, such as an industrial camera.

In step S130, image processing may be implemented by software such as Haicon.

In step S140, the first displacement platform 4 is controlled according to the alignment parameter to drive the fixture assembly to move to align the first alignment mark and the second alignment mark, so that the alignment accuracy between the first fixture 1 and the second fixture 2 may be ensured, and thus the accurate and rapid alignment of the base assembly may be achieved.

In some optional embodiments, in order to achieve the alignment between the first alignment mark and the second alignment mark, in the step of processing the first image and the second image to acquire the alignment parameter of the first alignment mark and the second alignment mark: the alignment parameter includes a displacement difference parameter and an angle difference parameter between the first alignment mark and the second alignment mark in a same plane.

The displacement difference parameter includes a distance parameter in a first direction X and a distance parameter in a second direction Y perpendicular to the first direction X between the first alignment mark and the second alignment mark. The angle difference parameter is that after the correction of the displacement difference parameter is completed, the first alignment mark or the second alignment mark may be rotated by a corresponding angle according to the angle difference parameter to make the first alignment mark and the second alignment mark coincide.

As the bonding member of some products is of an asymmetric structure, which generally means that the glass cover plate is of the asymmetric structure, there will be an offset between centers of the bonding member and a corresponding fixture of the fixture assembly, resulting in a large error in actual bonding. As there may also be an offset between the centers of the display module and a corresponding fixture of the fixture assembly, and the bonding member and the display module are fixed on the bonding member base 6 and the display module base 7 respectively, there will also be a certain offset between the fixture assembly and the bonding member base 6 and the display module base 7. During actual adjustment, the above offsets shall be compensated to ensure the bonding yield. In some optional embodiments, the correction method further includes acquiring a center error offset parameter between the bonding member base 6 and the first fixture 1 and a center error offset parameter between the display module base 7 and the second fixture 2 to calibrate the alignment parameter. Specifically, the fixture assembly may be driven to move according to the center error offset parameters to eliminate a center error between the base assembly and the fixture assembly.

Figure 3:
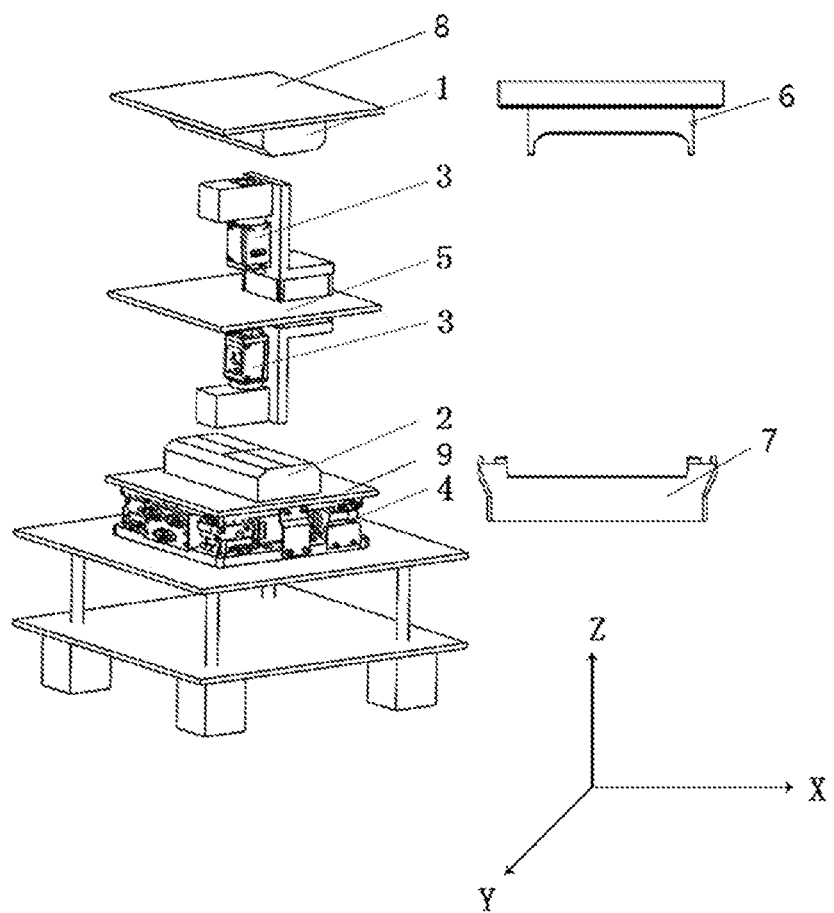
FIG. 3 is a structure diagram of a display panel bonding device according to embodiments of the application.

The application also provides a display panel bonding device. FIG. 3 shows a structure diagram of an embodiment of the display panel bonding device of the application. As shown in FIG. 3, the display panel bonding device according to the embodiment of the application includes: the base assembly, including the bonding member base 6 for mounting a member to be bonded, and the display module base 7 for mounting the display module to be bonded; a first support 8 having a first mounting position for the bonding member base; a second support 9 having a second mounting position for the display module base; and the correction apparatus according to any embodiment of the first aspect, wherein the first fixture 1 is mounted at the first mounting position for the bonding member base on the first support 8, and the second fixture 2 is mounted at the second mounting position for the display module base on the second support 9.

The bonding member base or the first fixture may be mounted at the first mounting position for the bonding member base on the first support 8, that is, the bonding member base 6 and the first fixture may be detachably connected with the first support 8 respectively. Similarly, the display module base or the second fixture may be mounted at the second mounting position for the display module base on the second support 9.

In some optional embodiments, the display panel bonding device further includes: the first displacement platform 4 connected to at least one of the first support 8 and the second support 9 to provide a three-dimensional displacement for at least one of the first support 8 and the second support 9; and a processing apparatus configured to process the first image and the second image to acquire the alignment parameter of the first alignment mark and the second alignment mark, and adjust the first displacement platform 4 according to the alignment parameter to align the first alignment mark and the second alignment mark. Optionally, the displacement accuracy error of the first displacement platform 4 is equal to or less than 3 μm.

Providing the three-dimensional displacement for at least one of the first support 8 and the second support 9 specifically means that the first displacement platform 4 may drive at least one of the first support 8 and the second support 9 to move in a horizontal plane to implement the alignment correction between the bonding member base 6 and the display module base 7 of the display panel bonding device. The first displacement platform 4 may also drive at least one of the first support 8 and the second support 9 to move in a vertical plane to implement a bonding process of the bonding member and the display panel.

Figure 4:
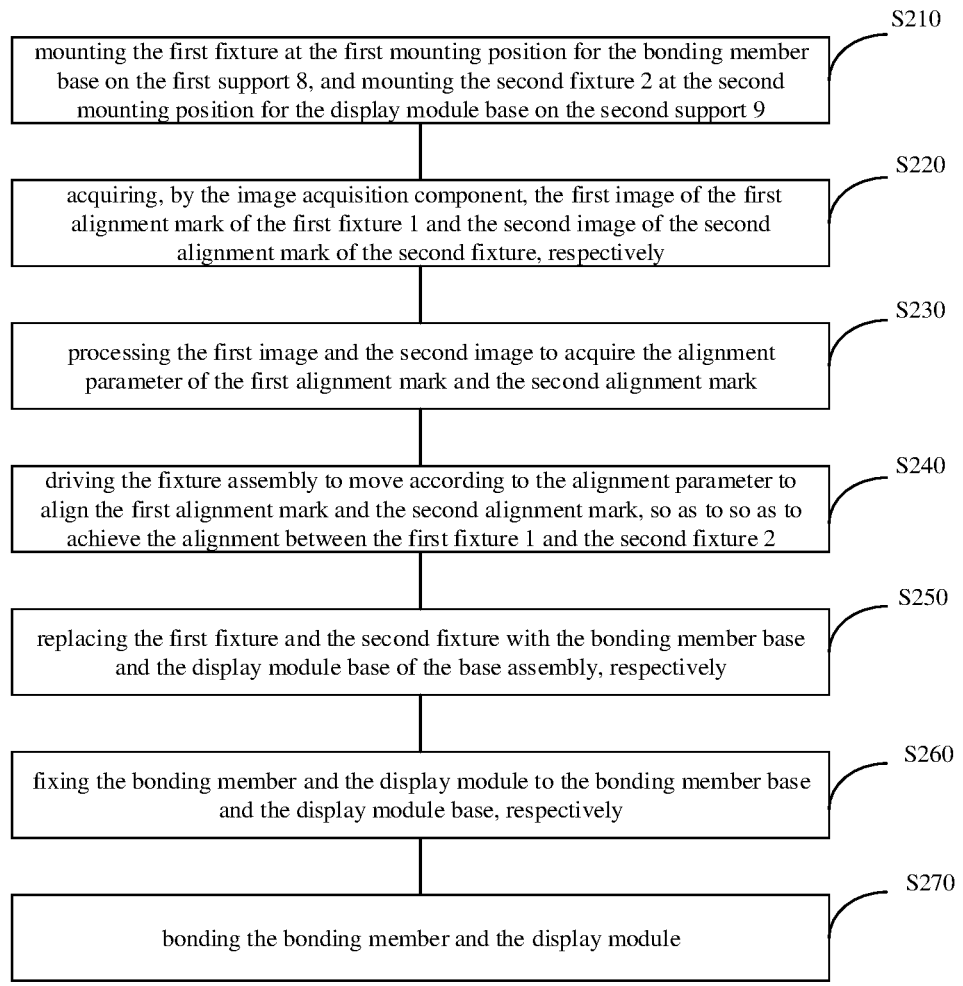
FIG. 4 is a flow diagram of a bonding method of a display panel bonding device according to embodiments of the application.

The application also provides a display panel bonding method based on the above display panel bonding device. FIG. 4 shows a flow diagram of an embodiment of the display panel bonding method of the application. The display panel bonding method according to the embodiment of the application includes:

S210: mounting the first fixture 1 at the first mounting position for the bonding member base on the first support 8, and mounting the second fixture 2 at the second mounting position for the display module base on the second support 9;

S220: acquiring, by the image acquisition component 3, the first image of the first alignment mark of the first fixture 1 and the second image of the second alignment mark of the second fixture 2, respectively;

S230: processing the first image and the second image to acquire the alignment parameter of the first alignment mark and the second alignment mark;

S240: driving the fixture assembly to move according to the alignment parameter to align the first alignment mark and the second alignment mark, so as to achieve the alignment between the first fixture 1 and the second fixture 2;

S250: replacing the first fixture 1 and the second fixture 2 with the bonding member base 6 and the display module base 7 of the base assembly, respectively;

S260: fixing the bonding member and the display module to the bonding member base 6 and the display module base 7, respectively; and S270: bonding the bonding member and the display module.

It should be noted that after equivalent alignment between the first fixture 1 and the second fixture 2 is achieved, it is required to remove the first fixture 1 and the second fixture 2 and replace them with the bonding member base 6 and the display module base 7. Therefore, it is required to detachably connect the first fixture 1 and the second fixture 2 with the first support 8 and the second support 9 respectively to facilitate replacement and subsequent bonding process. In order to realize detachable connection, a dowel pin, a claw, a bench vise or another equipment may be used. Any detachable connection mode that can facilitate the disassembly of the first fixture 1 and the second fixture 2 and ensure fixation stability and accuracy may be applied to the technical solutions provided in the application.

Optionally, a machining accuracy error of the first fixture and the second fixture is less than 10 μm, the displacement accuracy error of the first displacement platform 4 and the second displacement platform 5 is less than 3 μm, and a mounting accuracy error of the image acquisition assembly is less than 5 μm, so that an overall correction accuracy error of the display panel bonding device and the correction apparatus adapted for adjusting the display panel bonding device is less than 50 μm with a high center alignment accuracy.

The bonding method of the display panel bonding device provided by the embodiments of the application may make the alignment of the fixture assembly having regular and plane alignment marks equivalent to the alignment of the base assembly with a curved surface or an irregular shape. That is, as the fixture assembly is aligned firstly, and then the first fixture 1 and the second fixture 2 are replaced with the bonding member base 6 and the display module base 7 of the base assembly respectively, which corresponds to the replacement of the display panel and the bonding member in different products with rapidity and accuracy, the bonding yield may be improved. Specifically, through experiments, compared with the prior art, the technical solutions provided in the application reduce a black spot rate by 10% and an adjustment time by 30%, and has compatibility with asymmetric bonding members.

According to the embodiments described above in the application, these embodiments neither exhaustively describe all details nor limit the application to only the specific embodiments described above. Obviously, many modifications and changes may be made according to the above description. The purpose of selecting and specifically describing these embodiments in this specification is to better explain the principle and practical application of the application, so that those skilled in the art can make good use of the application and the modified use based on the application. This application is limited only by the claims and the full scope and equivalents thereof.

What is claimed is:

1. A correction apparatus comprising:
    a fixture assembly comprising a first fixture and a second fixture coordinating with each other, wherein the first fixture is provided with a first alignment mark, the second fixture is provided with a second alignment mark, and alignment between the first fixture and the second fixture is achieved via the first alignment mark and the second alignment mark; and
    an image acquisition assembly comprising a first image acquisition unit configured to acquire a first image of the first alignment mark of the first fixture and a second image acquisition unit configured to acquire second image of the second alignment mark of the second fixture, wherein a first image acquisition unit and the second image acquisition unit are aligned on a straight line between the first fixture and the second fixture, and the first image and the second image are used for acquiring an alignment parameter of the first alignment mark and the second alignment mark to correct the alignment between the first fixture and the second fixture.

2. The correction apparatus according to claim 1, wherein the first fixture comprises a first plane, on which the first alignment mark is provided, the second fixture comprises a second plane, on which the second alignment mark is provided, and the first plane and the second plane are respectively axisymmetric or centrosymmetric figures.

3. The correction apparatus according to claim 1, further comprising:
a first displacement platform configured to assemble and drive at least one of the first fixture or the second fixture to move to achieve the alignment between the first fixture and the second fixture.

4. The correction apparatus according to claim 3, further comprising:
a processing module, configured to process the first image and the second image to acquire the alignment parameter of the first alignment mark and the second alignment mark, and adjust the first displacement platform according to the alignment parameter so as to align the first alignment mark and the second alignment mark.

5. The correction apparatus according to claim 4, wherein the first displacement platform has a displacement accuracy error equal to or less than 3 μm.

6. The correction apparatus according to claim 1, wherein a first shooting direction of the first image acquisition unit faces the first alignment mark and a second shooting direction of the second image acquisition unit faces the second alignment mark, and the first shooting direction is opposite to the second shooting direction.

7. The correction apparatus according to claim 6, further comprising:
a second displacement platform, located between the first image acquisition unit and the second image acquisition unit and configured to assemble and drive at least one of the first image acquisition unit or the second acquisition unit to move to achieve alignment between the first image acquisition unit and the second acquisition unit and alignment between the first image acquisition unit and the second acquisition unit and the fixture assembly.

8. The correction apparatus according to claim 7, wherein the second displacement platform has a displacement accuracy error equal to or less than 5 μm.

9. The correction apparatus according to claim 3, further comprising:
a bonding member base adapted to replace the first fixture installed on the first displacement platform and accommodate a curved cover glass; and
a display module base adapted to replace the second fixture base installed on the first displacement platform and accommodate a display module.

10. The correction apparatus according to claim 3, wherein the first displacement platform is further configured to:
drive the first fixture moving within a first plane; and
drive the second fixture moving within a second plane, wherein the first plane is set parallel to the second plane.

11. The correction apparatus according to claim 6, wherein the second displacement platform further comprises:
a first fixing arm and a second fixing arm, the first fixing arm and the second fixing arm are symmetrically set about the second platform, the first image acquisition unit installed on the first fixing arm, and the second image acquisition unit installed on the second fixing arm, and the first image acquisition unit and the second image acquisition are arranged up and down.

12. The correction apparatus according to claim 1, wherein the first alignment mark and the second alignment mark are figures, a center point of the first alignment mark coincides with a center point of the first plane, and a center point of the second alignment mark coincides with a center point of the second plane.

13. The correction apparatus according to claim 1, wherein the first alignment mark has the same shape as the second alignment mark.

14. The correction apparatus according to claim 1, wherein the first alignment mark comprises at least two crossed first grooves and the second alignment mark comprises at least two crossed second grooves.

* * * * *